United States Patent
Hibino et al.

[11] Patent Number: 6,119,485
[45] Date of Patent: Sep. 19, 2000

[54] PRESS-MOLDING DIE, METHOD FOR MANUFACTURING THE SAME AND GLASS ARTICLE MOLDED WITH THE SAME

[75] Inventors: Kunio Hibino; Makoto Umetani; Hidenao Kataoka, all of Osaka, Japan

[73] Assignee: Matsushita Electric Industrial Co., Ltd., Osaka, Japan

[21] Appl. No.: 09/026,379

[22] Filed: Feb. 19, 1998

[30] Foreign Application Priority Data

Feb. 21, 1997 [JP] Japan ..................................... 9-037886
Nov. 14, 1997 [JP] Japan ..................................... 9-312989

[51] Int. Cl.[7] ........................ C03B 35/00; C03B 23/20; C03B 33/08; C03B 11/00; C03B 13/16
[52] U.S. Cl. ..................................... 65/305; 65/26; 65/36; 65/305; 65/374.11; 249/116; 428/633
[58] Field of Search ............................ 249/116; 65/305, 65/374.11, 26, 36; 428/630, 632, 633

[56] References Cited

U.S. PATENT DOCUMENTS

| | | |
|---|---|---|
| 4,685,948 | 8/1987 | Kuribayashi et al. . |
| 4,721,518 | 1/1988 | Monji et al. . |
| 4,794,053 | 12/1988 | Tustison ................................ 428/627 |
| 4,830,655 | 5/1989 | Franek et al. . |
| 4,842,633 | 6/1989 | Kuribayashi et al. . |
| 4,887,791 | 12/1989 | Tangari et al. . |
| 4,889,548 | 12/1989 | Kriegesmann et al. .................. 65/305 |
| 5,125,949 | 6/1992 | Hirota et al. . |
| 5,171,348 | 12/1992 | Umetani et al. . |
| 5,380,349 | 1/1995 | Taniguchi et al. . |

FOREIGN PATENT DOCUMENTS

| | | |
|---|---|---|
| 0 404 481 | 12/1990 | European Pat. Off. . |
| 38 09 836 | 10/1989 | Germany . |
| 44 14 552 | 11/1995 | Germany . |
| 1-33022 | 2/1989 | Japan . |
| 1-148714 | 6/1989 | Japan . |
| 2-51434 | 2/1990 | Japan . |
| 2-89610 | 3/1990 | Japan . |
| 2-137914 | 5/1990 | Japan . |
| 4-310529 | 11/1992 | Japan . |
| 4-317428 | 11/1992 | Japan . |
| 5-78145 | 3/1993 | Japan . |
| 5-124825 | 5/1993 | Japan . |
| 6-16433 | 1/1994 | Japan . |

OTHER PUBLICATIONS

Communication from European Patent Office and attached Search Report.

*Primary Examiner*—Stanley S. Silverman
*Assistant Examiner*—Jacqueline A. Ruller
*Attorney, Agent, or Firm*—Merchant & Gould P.C.

[57] ABSTRACT

A press-molding die comprises a base material, an intermediate layer formed on a surface of the base material and a protective layer formed on the intermediate layer. The base material comprises an inorganic oxide. The intermediate layer comprises a material that adheres to both the base material and the protective layer and is heat resistant at high temperatures wherein the die is used. The protective layer comprises at least one metal film selected from the group consisting of tungsten (W), platinum (Pt), palladium (Pd), rhodium (Rh), ruthenium (Ru), iridium (Ir), osmium (Os), rhenium (Re), tantalum (Ta) and alloys thereof.

11 Claims, 3 Drawing Sheets

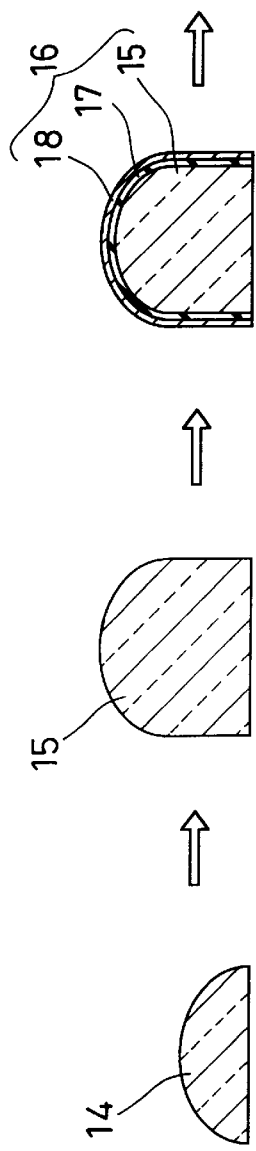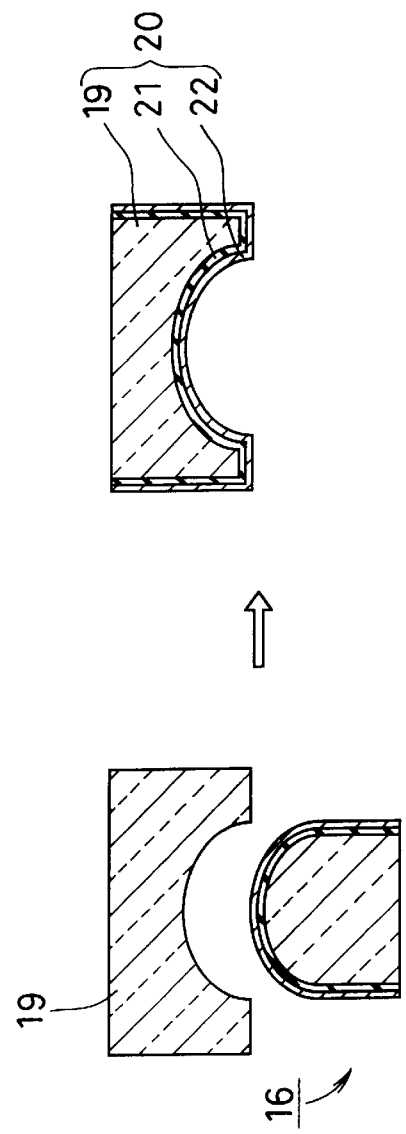

PRESS-MOLDING DIE, METHOD FOR MANUFACTURING THE SAME AND GLASS ARTICLE MOLDED WITH THE SAME

FIELD OF THE INVENTION

The present invention relates to a press-molding die for low-cost mass production of a glass substrate for a magnetic disk that is suitable as a recording medium, a method for manufacturing this die and a method for manufacturing the glass substrate for a magnetic disk. The present invention also relates to a press-molding die to be used in low-cost mass production of a high-precision optical glass element such as an optical lens, a method for manufacturing this die and a method for manufacturing the optical lens.

BACKGROUND OF THE INVENTION

In the field of magnetic recordings, especially in the field of magnetic disks, performance is enhanced by making the medium smaller and thinner and increasing its capacity, but this has to accommodate high precision of the magnetic recording medium. Recently, there has been active discussion on glass substrates with high rigidity and high hardness that can be easily smoothed and thus are very useful to increase density and reliability.

Hitherto, in the course of manufacture, after cutting the glass substrates for magnetic disks into a predetermined size, the glass substrates were polished one by one in a polishing step to obtain a smooth surface. However, there were the problems, that the polishing step has to be performed with high precision and the number of processing steps is large.

On the other hand, a press-molding method for the field of optical glass element production that enables high product quality and high productivity is widely discussed and its practical use is already underway.

As a press-molding die, a special die that does not deteriorate when glass is repeatedly molded is necessary and has been variously discussed.

Hard metal (tungsten carbide), cermet, zirconia, silicon carbide and other ceramics are used as a base material for press-molding dies, and a die has been developed that is coated with a protective layer with good mold releasing properties, oxidation resistance and chemical resistance, to protect the base material and prevent adhesion of the glass to the die at the time of mold release.

For example, Publication of Unexamined Patent Application (Tokkai) No. Hei 2-137914, discloses a die having a noble metal alloy film applied to a hard metal surface, and a fine pattern formed on the alloy surface. However, there were problems in that the hard metal (tungsten carbide) or the cermet used as a base material has poor processability, that it is difficult to obtain sufficient smoothness (on the nm order) to mold substrates for magnetic disks and that defects occurred frequently in the surface at the time of processing.

Moreover, the fine processing for the noble metal alloy film is usually very troublesome and the desired pattern is difficult to obtain, so that the quality of the obtained magnetic disk substrates was often inferior.

In optical elements such as optical lenses and prisms, small irregularities in the surface of the die can lead to an increase of scattered light, so that lenses with a smoother surface are desirable, yet conventional molds reached their limit.

Various techniques have been presented that use, as a molding base material, a glass material in which sufficient smoothness for use as a substrate for magnetic disks can be easily attained. Tokkai No. Hei 1-148714 discloses glass as the base material for press-molding, and fabrication of a protective layer of a ceramic or a noble metal material. Tokkai No. Sho 64-33022 suggests a die for molding an optical element using a fluoride such as $MgF_2$ or an oxide such as $SiO_2$ as a mold release film. Tokkai No. Hei 2-51434 discloses a die for molding optical disks with glass as the base material for the press-mold, having a film with a fine pattern formed by fine processing on the surface, wherein a carbon film as a protective layer and an intermediate film of silicon carbide and silicon nitride are formed.

However, the above examples do not have enough durability to withstand the repeated use for press molding under severe heat and pressure, so that the surface roughness of the press surface increases with long-term repeated use. Moreover, exfoliation of the microscopic protective layer may occur and the product quality may deteriorate due to changes in the fine pattern, so that these techniques cannot adequately answer the recent demand to achieve higher durability and longer life-expectancy.

Conventionally, a grinding method, performed by rotating a disk-shaped diamond grinding stone, was used to process the mold, but so far, a disk-shaped diamond grinding stone with a diameter of less than 2 mm could not be produced, and a concave die of a smaller diameter could not be processed, which posed a limit to the production of optical glass elements by the press molding method.

SUMMARY OF THE INVENTION

In order to overcome the problems of the prior art, it is a first purpose of the present invention to provide: a press-molding die for magnetic disk substrates and optical glass elements having a very smooth surface and a very precise shape corresponding to the magnetic disk substrate or the optical glass element to be manufactured, so that a magnetic disk substrate and an optical glass element can be manufactured by transferring the die shape of the press-molding die with high precision and accuracy, and little deterioration of the die is caused by repeated use over a long period; a method for manufacturing such a press-molding die; and a magnetic disk glass substrate and an optical glass element manufactured with such a press-molding die.

The second purpose of the present invention is to provide a press-molding die for a convex optical glass element less than 2 mm in diameter, which conventionally could not be produced by press-molding, a method for manufacturing the same and an optical glass element manufactured with such a press-molding die.

In order to achieve these purposes, a press-molding die according to the present invention comprises a press-molding die comprising: a base material, an intermediate layer formed on a surface of the base material and a protective layer formed on the intermediate layer, wherein: the base material comprises an inorganic oxide; the intermediate layer comprises a material which adheres to both the base material and the protective layer and is heat resistant at high temperatures wherein the die is used; and the protective layer comprises at least one metal film selected from the group consisting of tungsten (W), platinum (Pt), palladium (Pd), rhodium (Rh), ruthenium (Ru), iridium (Ir), osmium (Os), rhenium (Re), tantalum (Ta) and alloys thereof.

It is preferable that the base material comprises an inorganic oxide including silicon oxide or aluminium oxide as a main component.

It is also preferable that the base material comprises an inorganic oxide that is a glass including silicon dioxide as a main component and at least one material selected from the group consisting of aluminium oxide, magnesium oxide, zinc oxide, alkali metal oxide and alkaline-earth metal oxide.

It is preferable that the glass has a glass transition temperature that is at least 50° C. higher than that of a glass to be press-molded.

It is preferable that the base material comprises at least one material selected from the group consisting of quartz glass and monocrystal alumina.

It is also preferable that the intermediate layer comprises at least one material selected from the group consisting of titanium (Ti), vanadium (V), chrome (Cr), zirconium (Zr), niobium (Nb), molybdenum (Mo), hafnium (Hf), tantalum (Ta), tungsten (W) and alloys thereof It is also preferable that the intermediate layer comprises a component that is included in the base material and a component that is included in the protective layer.

It is preferable that the base material comprises an inorganic oxide including aluminium oxide as a main component; the protective layer comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and the intermediate layer comprises a mixture of at least one aluminium compound selected from the group consisting of aluminium oxide and aluminium nitride with a component of the protective layer.

It is also preferable that the base material comprises an inorganic oxide including silicon oxide as a main component; the protective layer comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and the intermediate layer comprises a mixture of at least one silicon compound selected from the group consisting of silicon oxide, silicon carbide and silicon nitride with a component of the protective layer.

It is preferable that the surface of the base material has an average roughness of less than 5 nm.

It is preferable that the intermediate layer has a thickness of 0.1–5 μm.

It is preferable that the protective layer has a thickness of 0.05–3 μm.

According to the present invention, a manufacturing method of a press-molding die comprises the steps of: machining a surface of a base material comprising an inorganic oxide precisely to an inverse shape of a glass article by at least one of the techniques selected from the group consisting of grinding, cutting, lapping, polishing and dry etching; forming an intermediate layer on the surface of the base material by a wet deposition process of electroplating or electroless plating or by a dry deposition process of vacuum deposition, sputtering or ion plating, which intermediate layer is heat resistant at high temperatures wherein the die is used and comprises a material that adheres to both the base material and a protective layer comprising at least one metal film selected from the group consisting of tungsten (W), platinum (Pt), palladium (Pd), rhodium (Rh), ruthenium (Ru), iridium (Ir), osmium (Os), rhenium (Re), tantalum (Ta) and alloys thereof; and forming the protective layer on the surface of the intermediate layer by a wet deposition process of electroplating of electroless plating or by a dry deposition process of vacuum deposition, sputtering or ion plating.

In this manufacturing method of a press-molding die, it is preferable that the base material comprises an inorganic oxide including silicon oxide or aluminium oxide as a main component.

In this manufacturing method, it is also preferable that the base material comprises an inorganic oxide that is a glass including silicon dioxide as a main component and at least one material selected from the group consisting of aluminium oxide, magnesium oxide, zinc oxide, alkali metal oxide and alkaline-earth metal oxide.

In this manufacturing method, it is also preferable that the glass has a glass transition temperature that is at least 50° C. higher than that of a glass to be press-molded.

In this manufacturing method, it is also preferable that the base material comprises at least one material selected from the group consisting of quartz glass and monocrystal alumina.

In this manufacturing method, it is also preferable that the intermediate layer comprises at least one material selected from the group consisting of titanium (Ti), vanadium (V), chrome (Cr), zirconium (Zr), niobium (Nb), molybdenum (Mo), hafnium (Hf), tantalum (Ta), tungsten (W) and alloys thereof.

In this manufacturing method, it is also preferable that the intermediate layer comprises a component that is included in the base material and a component that is included in the protective layer.

In this manufacturing method, it is also preferable that the base material comprises an inorganic oxide including aluminium oxide as a main component; the protective layer comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and the intermediate layer comprises a mixture of at least one aluminium compound selected from the group consisting of aluminium oxide and aluminium nitride with a component of the protective layer.

In this manufacturing method, it is also preferable that the base material comprises an inorganic oxide including silicon oxide as a main component; the protective layer comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and the intermediate layer comprises a mixture of at least one silicon compound selected from the group consisting of silicon oxide, silicon carbide and silicon nitride with a component of the protective layer.

In this manufacturing method, it is also preferable that the surface of the base material after machining has an average roughness of less than 5 nm; the intermediate layer has a thickness of 0.1–5 μm after forming on the surface of the base material; and the protective layer has a thickness of 0.05–3 μm after forming on the intermediate layer.

In this manufacturing method, it is also preferable that the surface shape of the base material after machining is an inverse shape of a substrate for a magnetic disk.

In this manufacturing method, it is also preferable that the shape of the substrate for the magnetic disk has at least one fine pattern selected from the group consisting of texture, pre-groove and servo pattern. The reason for this is as follows:

When the floating height of a magnetic head is lowered in a magnetic hard disk with high surface smoothness, a problem known as "head stick" occurs frequently. When the device is started or stopped, the magnetic is in gliding contact with the magnetic disk. To start or to stop a rotation in this situation, friction occurs between the magnetic head and the magnetic disk, the surface of the magnetic head or the magnetic disk is abraded, which leads to a deterioration of the electrical conversion properties. In extreme cases, it leads to adhesion between the magnetic head to the magnetic disk and the magnetic head and the magnetic disk are damaged or even destroyed.

In order to achieve a lower floating height and avoid head stick, a surface roughness (so-called "texture") is employed within a possible range. Conventionally, a surface roughness (texture) is formed onto the entire disk or parts of the disk by such methods as contact polishing the disk surface with polishing tape to form a convex/concave pattern in the surface, or forming convex/concave pattern in the surface by laser irradiation. It is thus preferable that the disk has such a texture.

In conventional hard disks, data were inscribed onto the smooth disk surface by a magnetic head. However, the S/N ratio of the recording signal deteriorates due to a leakage field from the end face of the magnetic head. To avoid this, a magnetic layer was formed on a substrate having a concentric circular convex/concave pattern called a "pre-groove", and the data were recorded in the convex portions. It is preferable that the disk has such a pre-groove pattern.

In conventional hard disks, servo information for controlling the position of the magnetic head was magnetically recorded in a servo pattern formed in the magnetic disk (the servo pattern consists of several rectangles of different sizes; the servo information results from the sizes and the positions of these rectangles). It has been proposed to employ such a servo pattern for high-density recordings by forming a convex/concave pattern on the substrate surface. It is preferable that the disk has such a servo pattern.

In the above manufacturing method, it is also preferable that the surface shape of the base material after machining is an inverse shape of an optical element.

According to the present invention, a manufacturing method of a press-molding die comprises the steps of providing a master press-molding die having a same shape as a glass article to be press-molded has; press-molding a glass including silicon dioxide as a main component by the master die; using the glass press-molded for a base material that has an inverse shape as a glass article to be press-molded has; forming an intermediate layer on the surface of the base material by a wet deposition process of electroplating or electroless plating or by a dry deposition process of vacuum deposition, sputtering or ion plating, which intermediate layer is heat resistant at high temperatures wherein the die is used and comprises a material that adheres to both the base material and a protective layer comprising at least one metal film selected from the group consisting of tungsten (W), platinum (Pt), palladium (Pd), rhodium (Rh), ruthenium (Ru), iridium (Ir), osmium (Os), rhenium (Re), tantalum (Ta) and alloys thereof; forming the protective layer on the surface of the intermediate layer by a wet deposition process of electroplating of electroless plating or by a dry deposition process of vacuum deposition, sputtering or ion plating.

In this manufacturing method, it is preferable that the press-molded glass for base material comprises press-molded glass that adheres to hard metal, cermet or ceramics.

In this manufacturing method, it is also preferable that the base material comprises a glass including silicon dioxide as a main component and at least one material selected from the group consisting of aluminium oxide, magnesium oxide, zinc oxide, alkali metal oxide and alkaline earth metal oxide.

In this manufacturing method, it is also preferable that the glass has a glass transition temperature that is at least 50° C. higher than that of a glass to be press-molded.

In this manufacturing method, it is also preferable that the intermediate layer comprises at least one material selected from the group consisting of titanium (Ti), vanadium (V), chrome (Cr), zirconium (Zr), niobium (Nb), molybdenum (Mo), hafnium (Hf), tantalum (Ta), tungsten (W) and alloys thereof.

In this manufacturing method, it is also preferable that the intermediate layer comprises a mixture of at least one silicon compound selected from the group consisting of silicon oxide, silicon carbide and silicon nitride with a component of the protective layer.

In this manufacturing method, it is also preferable that the surface of the base material after forming has an average roughness of less than 5 nm; the intermediate layer has a thickness of 0.1–5 $\mu$m after forming on the surface of the base material; and the protective layer has a thickness of 0.05–3 $\mu$m after forming on the intermediate layer.

In this manufacturing method, it is also preferable that the surface shape of the base material after forming is an inverse shape of a substrate for a magnetic disk.

In this manufacturing method, it is also preferable that the shape of the substrate for the magnetic disk has at least one fine pattern selected from the group consisting of texture, pre-groove and servo pattern.

In this manufacturing method, it is also preferable that the surface shape of the base material after forming is an inverse shape of an optical element.

According to the present invention, a manufacturing method of a press-molding die comprises the steps of providing a master press-molding die having an inverse shape as a glass article to be press-molded has; manufacturing a first press-molding die that has a same shape as a glass article has; press molding a glass including silicon dioxide as a main component by the first die; using the glass press-molded for a base material that has an inverse shape as a glass article to be press-molded has; forming an intermediate layer on the surface of the base material by a wet deposition process of electroplating or electroless plating or by a dry deposition process of vacuum deposition, sputtering or ion plating, which intermediate layer is heat resistant at high temperatures wherein the die is used and comprises a material that adheres to both the base material and a protective layer, comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and forming the protective layer on the surface of the intermediate layer by a wet deposition process of electroplating or electroless plating or by a dry deposition process of vacuum deposition, sputtering or ion plating. In this manufacturing method of a press-molding die, a first press-molding die that has a same shape as a glass article has is manufactured by press-molding a glass including silicon dioxide as a main component by the master die; using the glass press-molded for a base material that has a same shape as a glass article to be press-molded has; forming an intermediate layer on the surface of the base material by a wet deposition process of electroplating or electroless plating or by a dry deposition process of vacuum deposition, sputtering or ion plating, which intermediate layer is heat resistant at high temperatures wherein the die is used and comprises a material that adheres to both the base material and a protective layer, comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and forming the protective layer on the surface of the intermediate layer by a wet deposition process of electroplating or electroless plating or by a dry deposition process of vacuum deposition, sputtering or ion plating.

In this manufacturing method of a press-molding die, it is preferable that the press-molded glass for base material comprises press-molded glass that adheres to hard metal, cermet or ceramics.

In this manufacturing method of a press-molding die, it is also preferable that the base material comprises a glass including silicon dioxide as a main component and at least one material selected from the group consisting of aluminium oxide, magnesium oxide, zinc oxide, alkali metal oxide and alkaline earth metal oxide.

In this manufacturing method of a press-molding die, it is also preferable that the glass has a glass transition temperature that is at least 50° C. higher than that of a glass to be press-molded.

In this manufacturing method of a press-molding die, it is also preferable that the intermediate layer comprises at least one material selected from the group consisting of titanium (Ti), vanadium (V), chrome (Cr), zirconium (Zr), niobium (Nb), molybdenum (Mo), hafnium (Hf), tantalum (Ta), tungsten (W) and alloys thereof.

In this manufacturing method of a press-molding die, it is also preferable that the intermediate layer comprises a mixture of at least one silicon compound selected from the group consisting of silicon oxide, silicon carbide and silicon nitride with a component of the protective layer.

In this manufacturing method of a press-molding die, it is also preferable that the surface of the base material after forming has an average roughness of less than 5 nm; the intermediate layer has a thickness of 0.1–5 µm after forming on the surface of the base material; and the protective layer has a thickness of 0.05–3 µm after forming on the intermediate layer.

In this manufacturing method of a press-molding die, it is also preferable that the surface shape of the base material after forming is an inverse shape of a substrate for a magnetic disk.

In this manufacturing method of a press-molding die, it is also preferable that the shape of the substrate for the magnetic disk has at least one fine pattern selected from the group consisting of texture, pre-groove and servo pattern.

In this manufacturing method of a press-molding die, it is also preferable that the surface shape of the base material after forming is an inverse shape of an optical element.

According to the present invention, a manufacturing method of a glass article comprises the steps of manufacturing a press-molding die; putting a glass preform for a glass article on the manufactured press-molding die; heating the glass preform above the softening temperature of the glass preform on the die; press-molding the glass preform by another die which is heated; and cooling the glass to retrieve it. In this manufacturing method of a glass article, the press-molding die is manufactured by machining a surface of a base material comprising an inorganic oxide precisely to an inverse shape of a glass article by grinding, cutting, lapping, polishing or dry etching; forming an intermediate layer on the surface of the base material by a wet deposition process of electroplating or electroless plating or by a dry deposition process of vacuum deposition, sputtering or ion plating, which intermediate layer is heat resistant at high temperatures wherein the die is used and comprises a material that adheres to both the base material and a protective layer, comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and forming the protective layer on the surface of the intermediate layer by a wet deposition process of electroplating or electroless plating or by a dry deposition process of vacuum deposition, sputtering or ion plating.

In this manufacturing method of a glass article, it is preferable that the base material comprises an inorganic oxide including silicon oxide or aluminium oxide as a main component.

In this manufacturing method of a glass article, it is also preferable that the base material comprises an inorganic oxide that is a glass including silicon dioxide as a main component and at least one material selected from the group consisting of aluminium oxide, magnesium oxide, zinc oxide, alkali metal oxide and alkaline-earth metal oxide.

In this manufacturing method of a glass article, it is preferable that the glass has a glass transition temperature that is at least 50° C. higher than that of a glass to be press-molded.

In this manufacturing method of a glass article, it is also preferable that the base material comprises at least one material selected from the group consisting of quartz glass and monocrystal alumina.

In this manufacturing method of a glass article, it is also preferable that the intermediate layer comprises at least one material selected from the group consisting of titanium (Ti), vanadium (V), chrome (Cr), zirconium (Zr), niobium (Nb), molybdenum (Mo), hafnium (Hf), tantalum (Ta), tungsten (W) and alloys thereof.

In this manufacturing method of a glass article, it is also preferable that the intermediate layer comprises a component that is included in the base material and a component that is included in the protective layer.

In this manufacturing method of a glass article, it is also preferable that the base material comprises an inorganic oxide including aluminium oxide as a main component; the protective layer comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and the intermediate layer comprises a mixture of at least one aluminium compound selected from the group consisting of aluminium oxide and aluminium nitride with a component of the protective layer.

In this manufacturing method of a glass article, it is also preferable that the base material comprises an inorganic oxide including silicon oxide as a main component; the protective layer comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and the intermediate layer comprises a mixture of at least one silicon compound selected from the group consisting of silicon oxide, silicon carbide and silicon nitride with a component of the protective layer.

In this manufacturing method of a glass article, it is also preferable that the surface of the base material after machining has an average roughness of less than 5 nm; the intermediate layer has a thickness of 0.1–5 μm after forming on the surface of the base material; and the protective layer has a thickness of 0.05–3 μm after forming on the intermediate layer.

In this manufacturing method of a glass article, it is also preferable that the surface shape of the base material after machining is an inverse shape of a substrate for a magnetic disk.

In this manufacturing method of a glass article, it is also preferable that the shape of the substrate for the magnetic disk has at least one fine pattern selected from the group consisting of texture, pre-groove and servo pattern.

In this manufacturing method of a glass article, it is also preferable that the surface shape of the base material after machining is an inverse shape of an optical element.

According to the present invention, a manufacturing method of a glass article comprises the steps of manufacturing press-molding die; putting a glass preform for a glass article on the manufactured press-molding die; heating the glass preform above the softening temperature of the glass preform on the die; press-molding the glass preform by another die which is heated; and cooling the glass to retrieve it. In this manufacturing method of a glass article, the press-molding die is manufactured by providing a master press-molding die which has a same shape as a glass article to be press-molded has; press-molding a glass including silicon dioxide as a main component by the master die; using the glass press-molded for a base material that has an inverse shape as a glass article to be press-molded has; forming an intermediate layer on the surface of the base material by a wet deposition process of electroplating or electroless plating or by a dry deposition process of vacuum deposition, sputtering or ion plating, which intermediate layer is heat resistant at high temperatures wherein the die is used and comprises a material that adheres to both the base material and a protective layer, comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and forming the protective layer on the surface of the intermediate layer by a wet deposition process of electroplating or electroless plating or by a dry deposition process of vacuum deposition, sputtering or ion plating.

In this manufacturing method of a glass article, it is preferable that the master press-molding die having a same shape as a glass article is press-molded by a die that has an inverse shape as the glass article has.

In this manufacturing method of a glass article, it is preferable that the press-molded glass for base material comprises press-molded glass that adheres to hard metal, cermet or ceramics.

In this manufacturing method of a glass article, it is preferable that the base material comprises a glass including silicon dioxide as a main component and at least one material selected from the group consisting of aluminium oxide, magnesium oxide, zinc oxide, alkali metal oxide and alkaline earth metal oxide.

In this manufacturing method of a glass article, it is preferable that the glass has a glass transition temperature that is at least 50° C. higher than that of a glass to be press-molded.

In this manufacturing method of a glass article, it is preferable that the intermediate layer comprises at least one material selected from the group consisting of titanium (Ti), vanadium (V), chrome (Cr), zirconium (Zr), niobium (Nb), molybdenum (Mo), hafnium (Hf), tantalum (Ta), tungsten (W) and alloys thereof.

In this manufacturing method of a glass article, it is preferable that the intermediate layer comprises a mixture of at least one silicon compound selected from the group consisting of silicon oxide, silicon carbide and silicon nitride with a component of the protective layer.

In this manufacturing method of a glass article, it is preferable that the surface of the base material after forming has an average roughness of less than 5 nm; the intermediate layer has a thickness of 0.1–5 μm after forming on the surface of the base material; and the protective layer has a thickness of 0.05–3 μm after forming on the intermediate layer.

In this manufacturing method of a glass article, it is preferable that the surface shape of the base material after forming is an inverse shape of a substrate for a magnetic disk.

In this manufacturing method of a glass article, it is preferable that the shape of the substrate for the magnetic disk has at least one fine pattern selected from the group consisting of texture, pre-groove and servo pattern.

In this manufacturing method of a glass article, it is preferable that the surface shape of the base material after forming is an inverse shape of an optical element.

The present invention makes it easy to manufacture a press-molding die for magnetic disk substrates or optical glass elements having a very smooth surface and a very precise fine pattern or shape corresponding to the magnetic disk glass substrate or the optical glass element to be formed.

When the press-molding die according to the present invention is used, a magnetic disk glass substrate or an optical glass element can be easily manufactured by transferring the die shape of the press-molding die with precision and high accuracy. Moreover, a press-molding die for microlenses, which hitherto could not be manufactured by press-molding, can be manufactured in large quantities at low cost.

Moreover, little deterioration of the die is caused by repeated use over a long period and the life expectancy of the die is extended.

Moreover, due to the above effects, a magnetic disk glass substrate or an optical glass element can be manufactured in large quantities at low cost.

BRIEF DESCRIPTION OF THE DRAWINGS

FIGS. 3A–E are schematic diagrams illustrating the manufacturing process of a die for press-molding an optical glass element according to Example 3 of the present invention.

DESCRIPTION OF THE PREFERRED EMBODIMENTS

Figure 1:
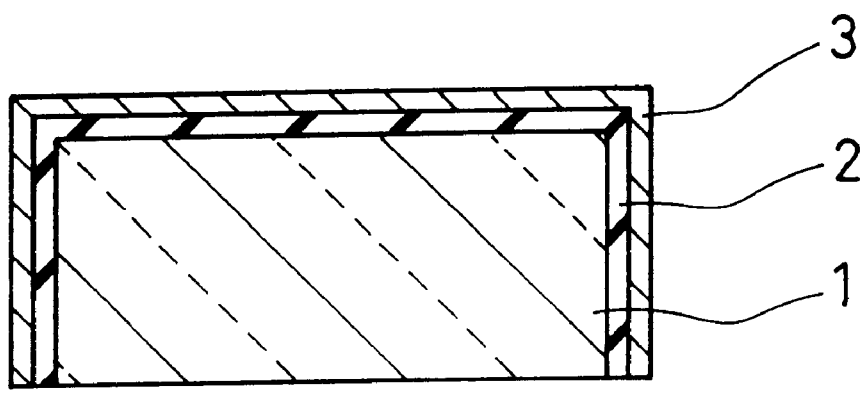
FIG. 1 is a sectional view of a die for press-molding the glass substrate for a magnetic disk according to an example of the present invention.

A first embodiment of the present invention is a press-molding die comprising: a die base material comprising an oxide; an intermediate layer comprising a metal or an alloy with high thermal resistance formed on a press-molding face of the die base material; and a protective layer that is a thin film comprising a noble metal or an alloy of noble metals formed on the intermediate layer.

A second embodiment of the present invention is a press-molding die comprising: a die base material comprising an oxide; an intermediate layer; and a protective layer that is a thin film comprising a noble metal or an alloy of noble metals formed on the intermediate layer; the intermediate layer comprising a component of the die base material of the molding die and a component of the protective layer and being formed on a press-molding face of the die base material.

A third embodiment of the present invention is a press-molding die comprising: a die base material having a smooth surface and comprising glass or monocrystal alumina; an intermediate layer comprising a metal or an alloy with high thermal resistance formed on a press-molding face of the die base material; and a protective layer that is a thin film comprising a noble metal or an alloy of noble metals formed on the intermediate layer.

A fourth embodiment present invention is a press-molding die comprising: a die base material having a smooth surface and comprising glass or monocrystal alumina; an intermediate layer; and a protective layer that is a thin film comprising a noble metal or an alloy of noble metals formed on the intermediate layer; the intermediate layer comprising a component of the die base material of the molding die and a component of the protective layer and being formed on a press-molding face of the die base material.

A fifth embodiment of the present invention is a press-molding die comprising: a die base material having a fine pattern corresponding to a glass article (for example, in a magnetic disk, lands (convex portions) and grooves (concave portions) that are formed in repetition as concentric circles, or, in the grating of an optical lens, lands (convex portions) and grooves (concave portions) that are formed in repetition) comprising glass or monocrystal alumina; an intermediate layer comprising a metal or an alloy with high thermal resistance formed on a press-molding face of the die base material; and a protective layer that is a thin film comprising a noble metal or an alloy of noble metals formed on the intermediate layer.

A sixth embodiment of the present invention is a press-molding die comprising: a die base material having a fine pattern corresponding to a glass article and comprising glass or monocrystal alumina; an intermediate layer; and a protective layer that is a thin film comprising a noble metal or an alloy of noble metals formed on the intermediate layer; the intermediate layer comprising a component of the die base material of the molding die and a component of the protective layer and being formed on a press-molding face of the die base material.

A seventh embodiment of the present invention is a press-molding die comprising: a die base material having a form corresponding to an optical glass element and comprising glass or monocrystal alumina; an intermediate layer comprising a metal or an alloy with high thermal resistance formed on a press-molding face of the die base material; and a protective layer that is a thin film comprising a noble metal or an alloy of noble metals formed on the intermediate layer.

An eighth embodiment of the present invention is a press-molding die comprising: a die base material having a form corresponding to an optical glass element and comprising glass or monocrystal alumina; an intermediate layer; and a protective layer that is a thin film comprising a noble metal or an alloy of noble metals formed on the intermediate layer; the intermediate layer comprising a component of the die base material of the molding die and a component of the protective layer and being formed on a press-molding face of the die base material.

A ninth embodiment of the present invention is a press-molding die comprising: a die base material having a smooth surface comprising glass or monocrystal alumina formed by dry-etching; an intermediate layer comprising a metal or an alloy with high thermal resistance formed by sputtering at least on a press-molding face of the die base material; and a protective layer that is a thin film comprising a noble metal or an alloy of noble metals formed on the intermediate layer after dry-etching the surface of the intermediate layer.

A tenth embodiment of the present invention is a press-molding die comprising: a die base material having a smooth surface and comprising glass or monocrystal alumina formed by dry-etching; an intermediate layer; and a protective layer that is a thin film comprising a noble metal or an alloy of noble metals formed on the intermediate layer after dry-etching the surface of the intermediate layer; the intermediate layer comprising a component of the die base material of the molding die and a component of a protective layer and being formed by sputtering at least on a press-molding face of the die base material.

An eleventh embodiment of the present invention is a press-molding die comprising: a die base material having a fine pattern corresponding to a glass article formed by dry-etching a smooth surface comprising glass or monocrystal alumina; an intermediate layer comprising a metal or an alloy with high thermal resistance formed by sputtering on a press-molding face of the die base material; and a protective layer that is a thin film comprising a noble metal or an alloy of noble metals formed by sputtering on a surface of the intermediate layer after dry-etching the surface of the intermediate layer.

A twelfth embodiment of the present invention is a press-molding die comprising: a die base material having a fine pattern corresponding to a glass article formed by dry-etching a smooth surface comprising glass or monocrystal alumina; an intermediate layer; and a protective layer that is a thin film comprising a noble metal or an alloy of noble metals formed on the intermediate layer after dry-etching the surface of the intermediate layer; the intermediate layer comprising a component of the die base material of the molding die and a component of a protective layer and being formed by sputtering at least on a press-molding face of the die base material.

A thirteenth embodiment of the present invention is a press-molding die comprising: a die base material formed by dry-etching a glass surface formed according to a molding matrix having the shape of a glass article; an intermediate layer comprising a metal or an alloy with high thermal resistance formed by sputtering on a press-molding face of the die base material; and a protective layer that is a thin film comprising a noble metal or an alloy of noble metals formed by sputtering on a surface of the intermediate layer after dry-etching the surface of the intermediate layer.

A fourteenth embodiment of the present invention is a press-molding die comprising: a die base material formed by dry-etching a glass surface formed according to a molding matrix having the shape of a glass article; an intermediate layer; and a protective layer that is a thin film comprising a noble metal or an alloy of noble metals formed on the intermediate layer after dry-etching the surface of the intermediate layer; the intermediate layer comprising a component of the die base material of the molding die and a component of a protective layer and being formed by sputtering at least on a press-molding face of the die base material.

A fifteenth embodiment of the present invention is a glass substrate for a magnetic disk or an optical glass element press-formed by using a press-molding die of the second, third, fourth, fifth, sixth, seventh, eighth, ninth, tenth, eleventh or twelfth embodiment of the present invention.

A sixteenth embodiment of the present invention is an optical glass element press-formed by using a press-molding die of the thirteenth or fourteenth embodiment of the present invention.

EXAMPLE 1

(1) The Press-Molding Die

FIG. 1 is an enlarged sectional view showing the structure of a die for press-molding the glass substrate for a magnetic disk according to an example of the present invention.

A base material 1 of the press-molding die includes glass with a glass transition temperature that is higher than the glass molding temperature. There are no specific limitations concerning the kind of glass to be used for the base material 1, but it is preferable that its mechanical strength at high temperatures is as good as possible and its coefficient of thermal expansion is as small as possible, because that will prevent a change in the form of the die due to repeated use. For example, quartz glass, which has a high glass transition temperature, is suitable as a base material for the press-molding die.

It is also possible to use silicon dioxide as the main component (more than 50 wt %) for the base material 1 with another component such as aluminum oxide, magnesium oxide, zinc oxide, an alkali metal oxide or an alkaline-earth metal oxide included according to necessity. In that case, the glass transition temperature of the glass material has to be higher than the molding temperature of the glass element to be molded. It is preferable that the components of the glass are selected so that the glass transition temperature is at least about 50° C. higher than the glass molding temperature.

The surface roughness of the press-molding face of the base material 1 for press-molding magnetic disks should be not more than 5 nm, preferably not more than 2 nm, most preferably not more than 1 nm. Such a smooth surface can be attained by polishing the surface with ceric oxide dust.

Monocrystal alumina also can be used as a base material for the press-molding die. Monocrystal alumina has a thermal resistance of more than about 2000° C. and, as in the case of glass, a surface roughness of less than 5 nm that is necessary for press-molding magnetic disks, preferably less than 2 nm, most preferably less than 1 nm, can be attained by precision polishing the base material with spherical grit grains of $SiO_2$ after lapping it with diamond grit.

An intermediate layer 2 is formed on the surface of the base material 1 by sputtering with a target made of a material comprising (i) at least one heat resistant metal from the group consisting of titanium (Ti), vanadium (V), chrome (Cr), zirconium (Zr), niobium (Nb), molybdenum (Mo), hafnium (Hf), tantalum (Ta), tungsten (W) and alloys thereof; and/or (ii) a mixture of at least one silicon compound from the group consisting of silicon carbide, silicon nitride and silicon oxide with a component of a protective layer 3, which is described below. This intermediate layer 2 increases the bond strength between the base material 1 and the protective layer 3 described below and prevents exfoliation of the protective layer 3 by repeated use of the press-molding die at high temperatures and high pressures.

This intermediate layer 2 is formed by DC sputtering, high frequency sputtering, magnetron sputtering or ion beam sputtering at film production conditions of $1 \times 10^{-2} – 1 \times 10^{-4}$ Torr gas pressure and 1–10W/cm$^2$ power density. The thickness of the intermediate layer should be 0.05–3 μm. Below this film thickness, it becomes difficult to attain a sufficient bond strength for the intermediate layer 2. Above this film thickness, the surface of the intermediate layer 2 becomes rough and tends to damage the surface smoothness of the base material 1.

The protective layer 3 is formed as a thin film on the surface of the intermediate layer 2 by sputtering with a target made of a material comprising at least one noble metal of the group consisting of platinum (Pt), palladium (Pd), rhodium (Rh), ruthenium (Ru), iridium (Ir), osmium (Os), rhenium (Re) tantalum (Ta) and alloys thereof. This protective layer 3 prevents adhesion of molded glass to the press-molding face of the base material 1 due to repeated press-molding of glass at high temperatures and high pressures, and deterioration of the surface smoothness due to surface roughening of the press-molding surface of the base material 1.

This protective layer 3 is formed by DC sputtering, high frequency sputtering, magnetron sputtering or ion beam sputtering at film production conditions of $1 \times 10^{-2} – 1 \times 10^{-4}$ Torr gas pressure, 1–10W/cm$^2$ power density and an appropriate sputtering target material. The thickness of the intermediate layer should be 0.1–5 μm. Below this film thickness, it is difficult to attain a sufficient bond strength for the protective layer 3. Above this film thickness, as in intermediate layer 2, the surface of the protective layer 3 becomes rough and, as in the intermediate layer 2, tends to damage the surface smoothness of the base material 1.

The bond strength between the base material 1, the intermediate layer 2 and the protective layer 3 can be increased by dry-etching the surface of the base material 1 with a high frequency plasma of argon or the like before the intermediate layer 2 and the protective layer 3 are formed on the base material 1. In this case, it is necessary to optimize the etching conditions, so that the surface of the base material 1 is not made rough by the dry-etching process.

Figure 2:
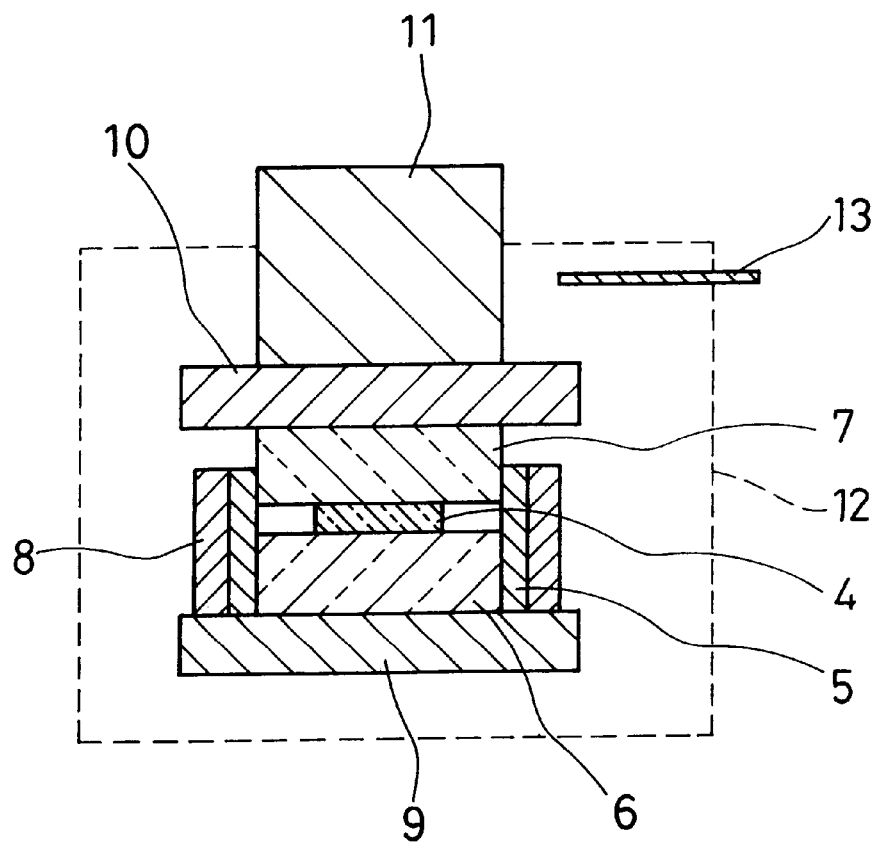
FIG. 2 is a schematic drawing showing the general structure of a press-molding machine using the die for press-molding according to an example of the present invention.

FIG. 2 shows the basic structure of a press-molding apparatus using the press-molding die according to the present invention.

A glass preform 4 is formed into a glass substrate for magnetic disks. A ring guide 5 controls the diameter and the thickness of the glass substrate for magnetic disks. A lower die 6 of the press-molding die is arranged at a lower portion on the inner side of the ring guide 5. An upper die 7 of the press-molding die is inserted at an upper portion on the inner side of the ring guide 5 and is movable in an upward and a downward direction (with respect to the drawing). A ring guide heater 8 heats the ring guide 5. A piston cylinder 11 pushes the upper die 7 downward and applies pressure to the glass preform 4 placed on the lower die 6. A chamber 12 encloses the main parts of the press-molding apparatus. A nitrogen gas inlet 13 introduces nitrogen gas into the chamber 12.

In such a press-molding apparatus, the ring guide heater 8, a lower die heater 9 and an upper die heater 10 heat up the ring guide 5, the lower die 6 and the upper die 7 respectively, the nitrogen gas inlet 13 introduces nitrogen gas into the chamber 12 and the piston cylinder 11 pushes the upper die 7 downward to apply pressure to the glass preform 4 placed on the lower die 6, so as to form a glass substrate for a magnetic disk.

Press-molding the glass substrate for a magnetic disk in an atmosphere with a low concentration of oxygen prevents oxidation of the die due to high press-molding temperature and increases the durability of the mold.

(2) Manufacturing Method for Press-Molding Die and Press-Molding Method Using the Same The following discussion specifically explains a method for manufacturing a magnetic disk substrate with a smooth surface and a method for manufacturing a die for press-molding a magnetic disk glass substrate according to the present invention, with reference to FIGS. 1 and 2.

First of all, the press-molding faces of the base material 1 of a pair of press-molding dies made of cylindrical quartz glass with a diameter of 48 mm and a thickness of 15 mm were mirror-polished with fine diamond grit of 0.1 μm grit size and then polished with ceric oxide until the surface roughness was only 0.5 nm. Then, the polished press-molding faces of the base material 1 were etched with a high frequency plasma of argon gas at $8 \times 10^{-3}$ Torr argon gas pressure and 2W/cm² power density.

Next, after the polishing was finished, a 0.2–0.3 μm thick intermediate layer 2 was formed by magnetron high frequency sputtering at $5 \times 10^{-3}$ Torr argon gas pressure and 5W/cm² power density using a target of various materials. The surface of this intermediate layer 2 was etched by argon gas high frequency sputtering at $8 \times 10^{-3}$ Torr argon gas pressure and 2W/cm² power density.

Finally, a thin-film-shaped protective layer 3 made of a noble metal alloy was formed on the surface of this etched intermediate layer 2 by magnetron high frequency sputtering with a target of various metals so as to manufacture sample press-molding dies 1–16 as shown in Table 1 below. Table 1 lists the specific compositions used for the intermediate layer 2 and the protective layer 3 of the sample press-molding dies 1–16.

A press-molding die without the intermediate layer 2 (Sample 17 in Table 1) and a press-molding die wherein the protective layer 3 is formed on the surface of hard metal that was mirror-polished with 0.1 μm grit size fine diamond grit (Sample 18 in Table 1) were manufactured as comparative examples.

Then, the sample press-molding dies 1–17 and 18 were installed in the press-molding apparatus shown in FIG. 2 and a cylindrical soda-lime glass preform 4 of 35 mm diameter was press-formed for 2 min at 700° C. temperature and 60 kg/cm² pressure in a nitrogen atmosphere of not more than 0.1 vol % oxygen concentration. The press-molding was continued under these conditions until the temperature had cooled down to 450° C. and then the press-formed glass substrate was retrieved from the press-molding apparatus. Thus, a disk-shaped glass substrate could be manufactured. This disk-shaped glass substrate was provided with a bore to obtain a glass substrate for a magnetic disk.

After such press-molding has been performed 3000 times, the surfaces of the press-molding die and a press-formed glass substrate for a magnetic disk were measured at five locations within a square of ca. 34 μm side-length using an AFM (atomic force microscope). The average of the measured surface roughnesses (SRa) was calculated and evaluated. Furthermore, the SRa of the press-formed glass substrate for a magnetic disk was measured with an interference-type 3D surface roughness meter and the number of coarse protrusions higher than 50 nm was measured. Table 1 shows the results of these measurements.

TABLE 1

The Die Base Material for Sample 18 is Hard Metal

| Sample No. | Intermediate layer Composition | Protective Layer Composition | Surface Roughness (Mold) (nm) At First | Surface Roughness (Mold) (nm) After 3000 times | Surface Roughness (Formed Substrate) (nm) At first | Surface Roughness (Formed Substrate) (nm) After 3000 times | Number of Protrusions (in the Formed Substrate) (protr./mm²) At first | Number of Protrusions (in the Formed Substrate) (protr./mm²) After 3000 times |
|---|---|---|---|---|---|---|---|---|
| 1 | Ti | Pt50—Ir50 | 0.8 | 1.3 | 0.7 | 1.2 | 0 | 0 |
| 2 | V | W50—Ru50 | 1.0 | 1.1 | 0.9 | 1.0 | 0 | 0 |
| 3 | Gr | Ir50—Re50 | 0.7 | 1.0 | 0.6 | 0.9 | 0 | 0 |
| 4 | Zr | Pd50—W50 | 1.1 | 1.1 | 1.1 | 1.0 | 0 | 0 |
| 5 | W | Ru50—Re50 | 1.4 | 1.5 | 1.3 | 1.3 | 0 | 0 |
| 6 | Nb | Os50—Rh50 | 1.6 | 1.7 | 1.4 | 1.5 | 0 | 0 |
| 7 | Moreover | Pt50—Re50 | 1.5 | 1.5 | 1.2 | 1.3 | 0 | 0 |
| 8 | Ta | Rh50—Ta50 | 1.3 | 1.6 | 1.5 | 1.6 | 0 | 0 |
| 9 | SiO₂—Pt | Pt50—Ir50 | 1.2 | 1.4 | 1.1 | 1.2 | 0 | 0 |
| 10 | SiO₂—Ir | Ir50—Re50 | 1.0 | 1.0 | 1.1 | 1.3 | 0 | 0 |
| 11 | SiO₂—Pd | Pd50—W50 | 0.9 | 1.1 | 0.8 | 0.9 | 0 | 0 |
| 12 | SiC—Rh | Rh50—Ta50 | 1.0 | 1.1 | 1.2 | 1.4 | 0 | 0 |
| 13 | SiC—W | W50—Ru50 | 1.3 | 1.4 | 1.3 | 1.5 | 0 | 0 |
| 14 | SiC—Ru | Ru50—Re50 | 1.5 | 1.5 | 1.3 | 1.3 | 0 | 0 |
| 15 | Si₃N₄—Os | Os50—Rh50 | 1.4 | 1.4 | 1.3 | 1.7 | 0 | 0 |
| 16 | Si₃N₄—Re | Pt50—Re50 | 1.4 | 1.6 | 1.5 | 1.6 | 0 | 0 |
| 17 | None | Pt50—Ir50 | 1.3 | 10.6 | 1.3 | 11.5 | 2 | 64 |
| 18 | None | Ir50—Re50 | 13.0 | — | 13.0 | — | 79 | — |

As becomes clear from Table 1, even in the 3000th press-formed glass-substrate for a magnetic disk, there was almost no change in the surface roughness compared to the first press-formed articles nor could formation of coarse protrusions be observed when the press-formed articles were manufactured with a press-molding die according to the present example (Sample 1–16).

On the other hand, when a press-molding die without intermediate layer 2 was used (Sample 17), the surface became very rough and the formation of coarse protrusions ≧50 nm could be observed.

When a press-molding die with a protective layer 3 formed on the surface of hard metal base material is used (Sample 18), then already in the first molded articles, the surface roughness was rough and coarse protrusions were formed. Furthermore, the occurrence of tiny partial film exfoliations in the surface of the press-molding die was observed with an optical microscope at ×400 magnification power.

This was an example of a method for manufacturing a magnetic disk glass substrate by press-molding with glass as a die base material and a method for manufacturing a die for press-molding a magnetic disk glass substrate, however, similar results could be attained for optical glass elements.

Moreover, similar results could be attained for the manufacturing of magnetic disk glass substrates and optical glass elements using press-molding dies with monocrystal alumina as the die base material.

EXAMPLE 2

(1) The Press-Molding Die

The following example of the present invention specifically explains (with reference to FIGS. 1 and 2) a method for manufacturing a magnetic disk glass substrate having a fine pattern and a method for manufacturing a die for press-molding a magnetic disk glass substrate.

In order to form a fine pattern on the surface of the base material 1 of the press-molding die, resist is applied by spin-coating and pre-baked. Then, a resist pattern is formed by conventional UV exposition, laser beam exposition, which draws the pattern with a laser beam, or electron beam exposition, which draws the pattern with an electron beam. Then, dry-etching is performed with the formed resist pattern as a mask and a pattern is formed on the surface of the base material 1.

The dry-etching should be performed by ion beam etching with argon gas, a fluoric gas such as $CF_4$ or a mixed gas of a fluoric gas and oxygen, electron cyclotron resonance (ECR) ion etching or another etching method with good directivity.

(2) Manufacturing Method for Press-Molding Die and Press-Molding Method Using the Same The following is a specific explanation of a method for manufacturing a magnetic disk substrate with a fine pattern and a method for manufacturing a die for press-molding such a magnetic disk glass substrate.

As in Example 1, the press-molding faces of the base material 1 of a pair of press-molding dies made of cylindrical quartz glass with a diameter of 48 mm and a thickness of 15 mm were mirror-polished with fine diamond grit and then polished with ceric oxide until the surface roughness was only 0.5 nm. Then, the polished press-molding faces of the base material 1 were spin-coated with positive electron beam resist (polymethyl methacrylate, PMMA), prebaked at 70° C. and a fine pattern of concentric circular 0.2 μm lands and 1.0 μm grooves was patterned by electron beam exposition, whose development formed a resist pattern.

Next, the polished press-molding face of the base material 1 was dry-etched by electron cyclotron resonance (ECR) ion etching with argon gas at a vacuum degree of $6 \times 10^{-4}$ Torr and 1000W power to form a fine pattern of 200 nm depth in the press-molding face of the base material 1. As in Example 1, an intermediate layer 2 was formed by magnetron high frequency sputtering using a target of various materials after etching the polished press-molding face of base material 1 into which a fine pattern has been formed with a high frequency argon gas plasma. The surface of this intermediate layer 2 was etched with a high frequency argon gas plasma.

Finally, a thin-film-shaped protective layer 3 made of a noble metal alloy was formed on the surface of this etched intermediate layer 2 by magnetron high frequency sputtering with a target of various materials so as to manufacture sample press-molding dies 19–36 as shown in Table 2 below. Table 2 lists the specific compositions used for the intermediate layer 2 and the protective layer 3 of the sample press-molding dies 19–36.

As a comparative example, a silicon oxide sputter film was formed on the press-molding face of a mirror-polished cylindrical quartz glass, a pattern was formed by electron beam exposition and dry-etching was performed with $CF_4$ to form a fine pattern. Then, a silicon carbide sputter film was formed on the press-molding surface of the polished base material 1 onto which a fine pattern has been formed. Then, a protective layer 3 made of carbon was formed by plasma CVD using a mixed gas of methane and hydrogen (Sample 37 in Table 2).

The sample press-molding dies 19–36 and 37 were installed in the press-molding apparatus shown in FIG. 2 and a cylindrical soda-lime glass preform 4 of 35 mm diameter was press-formed for 2 min at 700° C. temperature and 60 kg/cm² pressure in a nitrogen atmosphere of not more than 0.1 vol % oxygen concentration. The press-molding was continued under these conditions until the temperature had cooled down to 450° C. and then the press-formed glass substrate was retrieved from the press-molding apparatus. Thus, a disk-shaped glass substrate could be manufactured. This disk-shaped glass substrate was provided with a bore to obtain a glass substrate for a magnetic disk.

The surface and the profile of the magnetic disk glass substrate were evaluated with a scanning electron microscope and it was ascertained that the lands and grooves were neatly transcribed onto the press-molding face of the press-molding die with a dimensional error of less than 10%. The lands had a surface roughness (SRa) of 0.8 nm, which was about the same level as the surface roughness of the press-molding face of the press-molding die.

After such press-molding has been performed 3000 times, the surface of the groove portions of the fine pattern in the press-molding face of the press-molding die and the press-molding face and the surface of the land portions in a press-formed glass substrate for a magnetic disk were measured at five locations within a ca. 34 μm square using an AFM (atomic force microscope). The average of the measured surface roughnesses (SRa) was calculated and evaluated. Furthermore, the surface of the press-formed glass substrate for a magnetic disk was measured with an interference-type 3D surface roughness meter and the number of coarse protrusions higher than 50 nm was measured. Table 2 shows the results of these measurements.

TABLE 2

| Sample No. | Intermediate layer Composition | Protective Layer Composition | Surface Roughness (Mold) (nm) | | Surface Roughness (Formed Substrate) (nm) | | Number of Protrusions (in the Formed Substrate) (protr./mm²) | |
|---|---|---|---|---|---|---|---|---|
| | | | At First | After 3000 times | At first | After 3000 times | At first | After 3000 times |
| 19 | Ti | Pt50—Ir50 | 0.9 | 1.4 | 0.7 | 1.1 | 0 | 0 |
| 20 | V | W50—Re50 | 1.1 | 1.2 | 1.0 | 1.2 | 0 | 0 |
| 21 | Cr | Ir50—Re50 | 0.6 | 0.8 | 0.5 | 0.7 | 0 | 0 |
| 22 | Zr | Pd50—W50 | 1.2 | 1.3 | 1.1 | 1.2 | 0 | 0 |
| 23 | W | Ru50—Re50 | 1.4 | 1.4 | 1.2 | 1.2 | 0 | 0 |
| 24 | Nb | Os50—Rh50 | 1.8 | 1.9 | 1.5 | 1.6 | 0 | 0 |
| 25 | Mo | Pt50—Re50 | 1.3 | 1.4 | 1.3 | 1.4 | 0 | 0 |
| 26 | Ta | Rh50—Ta50 | 1.5 | 1.6 | 1.3 | 1.4 | 0 | 0 |
| 27 | Hf | Os50—Rh50 | 1.2 | 1.4 | 1.1 | 1.3 | 0 | 0 |
| 28 | $SiO_2$—Pt | Pt50—Ir50 | 0.9 | 1.1 | 0.8 | 0.8 | 0 | 0 |
| 29 | $SiO_2$—Ir | Ir50—Re50 | 1.1 | 1.0 | 1.1 | 1.2 | 0 | 0 |
| 30 | $SiO_2$—Pd | Pd50—W50 | 1.0 | 1.2 | 0.9 | 0.8 | 0 | 0 |
| 31 | SiC—Rh | Rh50—Ta50 | 0.9 | 1.0 | 1.1 | 1.3 | 0 | 0 |
| 32 | SiC—Pt | Pt50—Ru50 | 1.4 | 1.3 | 1.5 | 1.4 | 0 | 0 |
| 33 | SiC—Ru | Ru50—Re50 | 1.3 | 1.6 | 1.2 | 1.3 | 0 | 0 |
| 34 | $Si_3N_4$—Os | Os50—Rh50 | 1.3 | 1.4 | 1.2 | 1.5 | 0 | 0 |
| 35 | $Si_3N_4$—Pt | Pt50—Re50 | 1.0 | 1.4 | 0.8 | 1.0 | 0 | 0 |
| 36 | $Si_3N_4$—Re | Re50—Ta50 | 1.3 | 1.5 | 1.3 | 1.6 | 0 | 0 |
| 37 | SiC | C | 1.0 | ≧20 | 1.1 | ≧20 | 0 | ≧200 |

As becomes clear from Table 2, even in the 3000th press-formed glass-substrate for a magnetic disk, there was almost no change in the surface roughness compared to the first press-formed articles nor could formation of coarse protrusions be observed when the press-formed articles were manufactured with a press-molding die according to the present invention (Sample 19–36).

On the other hand, when the press-molding die having a protective layer 3 of carbon formed on the base material 1 (Sample 37) was observed with an optical microscope at 33 800 magnification power, defects such as exfoliation of the protective layer 3 in an edge portion of the fine pattern and changes in the fine pattern could be observed in the surface of the press-molding die.

This was an example of a method for manufacturing a magnetic disk glass substrate by press-molding with glass as a die base material and a method for manufacturing a die for press-molding a magnetic disk glass substrate having a fine pattern of lands and grooves, however, similar results could be attained for optical glass elements having a fine pattern.

Moreover, similar results could be attained for the manufacturing of magnetic disk glass substrates and optical glass elements using press-molding dies with monocrystal alumina as the die base material.

EXAMPLE 3

(1) The Press-Molding Die

The following is a specific explanation (with reference to FIGS. 3A–3E) of a method for manufacturing a convex optical glass element less than 2 mm in diameter, which previously could not be manufactured with a press-molding method, and a method for manufacturing a die for press-molding such an optical glass element.

FIGS. 3A–3E illustrate the basic steps for manufacturing a die for press-molding an optical glass element according to an example of the present invention. Numeral 14 indicates a model of the lens to be manufactured (called "lens model" below). For a forming base material 15, the press-molding face of a cylindrical glass is processed with a grinding method and polished to obtain a curved surface or a flat surface having the same smoothness and the same shape as the upper or lower curved surface or the flat surface of the lens model 14 in FIG. 3. An intermediate layer 17 and a protective layer 18 are formed in this order on the surface of the base material 15 to obtain a molding matrix 16. A base material 19 for a press-molding die that has a surface with the same smoothness and the same shape as the upper or lower curved surface or the flat surface of the lens model 14 is formed by pressing the press-molding face of the molding matrix 16 into the plane of a heated cylindrical glass. This base material 19 is made of a glass with a transition temperature that is at least about 50° C. lower than the molding temperature of the glass used for the base material 15 of the molding matrix. A molding die 20 is obtained by forming an intermediate layer 21 and a protective layer 22 in that order on the surface of the base material 19.

To manufacture the molding die 20, first, the press-molding face of. cylindrical glass is processed with a grinding method and polished to form the base material 15 of the molding matrix (see FIG. 3B) having the same smoothness and the same shape as one curved or flat surface of the lens model 14 (see FIG. 3A). The molding matrix 16 is manufactured by forming the intermediate layer 17 and the protective layer 18 in that order on the surface of this base material 15 (see FIG. 3C).

Subsequently, a base material 19 for a press-molding die that has a convex or flat surface with the same smoothness and the same shape as one curved surface or the flat surface of the lens model 14 is formed by pressing the press-molding face of the molding matrix 16 on the press-molding face of a heated cylindrical glass (FIG. 3D). The molding die 20 is manufactured by forming the intermediate layer 21 and the protective layer 22 in that order on the surface of this base material 19 (see FIG. 3E).

Another molding die 20 that has a convex or flat surface with the same smoothness and the same shape as the other curved surface or flat surface of the lens model 14 can be produced with the same method of manufacturing, so that a pair of molding dies 20 can be produced.

As a result, a convex or concave lens with a small diameter that has same surface smoothness as a polished glass surface, which hitherto could not be produced, can now be produced.

(2) Manufacturing Method for Press-Molding Die and Press-Molding Method Using the Same The following is a more specific explanation (with reference to FIGS. 3A–E) of a method for manufacturing a convex optical glass element less than 2 mm in diameter and a method for manufacturing a die for press-molding such an optical glass element.

First of all, two cylindrical pieces of quartz glass 1.8 mm in diameter and 5 mm in length were polished. A base material 15 of a molding matrix for a microlens having a convex press-molding surface with a radius of curvature of 0.9 mm and a base material 15 of a press-molding matrix for a microlens having a flat press-molding surface were formed and the press-molding faces of these base materials 15 were polished with ceric oxide grit until their surface roughness was only 1 nm.

Then, an intermediate layer 17 made of silicon carbide—platinum (SiC—Pt, with 50 wt % Pt content) was formed by magnetron high frequency sputtering, after the polished press faces of these base materials 15 were etched with a high frequency argon gas plasma, as in Example 1. The surface of this intermediate layer 17 was etched with a high frequency argon gas plasma. Subsequently, a protective layer 18 made of a platinum-rhodium alloy thin film (Pt—Rh, with 20 wt % Rh content) was formed by magnetron high frequency sputtering on the surface of the intermediate layer 17, so as to produce a molding matrix 16.

Subsequently, this molding matrix 16 was installed in the press molding apparatus in FIG. 2 to produce a die 20 for forming a microlens. To be specific, a cylindrical pyrex glass preform of 6 mm diameter and 6 mm height was placed between the molding matrix 16 and a die with a flat press-molding face and press-formed for 5 min at 750° C. temperature and 50 kg/cm² pressure. The press-molding was continued under these conditions until the temperature had cooled down to 500° C. and then the press-formed glass was retrieved from the press-molding apparatus. Thus, a base material 19 of a molding die having a concave press-molding face with a curvature radius of 0.9 mm was formed.

Furthermore, one face of a cylindrical pyrex glass preform of 6 mm diameter and 6 mm height was polished so as to form a base material 19 for a molding die having a flat press-molding face.

Then, after etching with high frequency argon gas plasma, as in Example 1, intermediate layers 21 were formed on the press-molding surfaces of the two base materials 19 of the two molding dies by magnetron high frequency sputtering using a target of various materials. The surfaces of these intermediate layers 21 were etched with high frequency argon gas plasma. A protective layer 22 was formed by magnetron high frequency sputtering with various noble metals as a target so as to manufacture sample pairs 38–55 of upper and lower press-molding dies 20 as shown in Table 3 below. Table 3 lists the specific compositions used for the intermediate layer 21 and the protective layer 22 of the sample press-molding dies 38–55.

As a comparative example, a press-molding die was manufactured, having magnesium fluoride deposited on the press-molding faces (Sample 56 in Table 3).

Then, the sample press-molding dies 38–55 and 56 were installed in the press-molding apparatus shown in FIG. 2 and a spherical lead oxide optical glass preform of 0.7 mm diameter, comprising 70 wt % PbO, 27 wt % SiO₂ and trace components for the rest, was press-formed for 2 min at 520° C. temperature and 40 kg/cm² pressure in a nitrogen atmosphere of not more than 0.1 vol % oxygen concentration. The press-molding was continued under these conditions until the temperature had cooled down to 300° C. and then the press-formed microlens was retrieved from the press-molding apparatus. Thus, a microlens could be manufactured.

After such press-molding has been performed 3000 times, the surfaces of the molding die 20 and a press-formed microlens formed with the molding die 20 were measured at five locations with an interference-type 3D surface roughness meter. The average surface roughness (RMS value) was calculated and evaluated. Table 3 shows the results of these measurements and the results of the observation of the surface condition of the press-molding die 20.

TABLE 3

| Sample No. | Intermediate layer Composition | Protective Layer Composition | Surface Roughness (Mold) (nm) At first | Surface Roughness (Mold) (nm) After 3000 times | Surface Roughness (Formed Substrate) nm At first | Surface Roughness (Formed Substrate) nm After 3000 times |
| --- | --- | --- | --- | --- | --- | --- |
| 38 | Ti | Pt50—Ir50 | 1.0 | 1.1 | 0.9 | 1.1 |
| 39 | V | W50—Ru50 | 1.2 | 1.4 | 1.0 | 1.4 |
| 40 | Cr | Ir50—Re50 | 1.0 | 1.2 | 0.9 | 1.2 |
| 41 | Zr | Pd50—W50 | 1.2 | 1.5 | 1.1 | 1.5 |
| 42 | W | Ru50—Re50 | 0.9 | 1.1 | 0.7 | 1.0 |
| 43 | Nb | Os50—Rh50 | 1.3 | 1.3 | 1.1 | 1.1 |
| 44 | Mo | Pt50—Re50 | 1.0 | 1.4 | 0.8 | 1.5 |
| 45 | Ta | Rh50—Ta50 | 0.7 | 0.9 | 0.7 | 0.9 |
| 46 | Hf | Pt50—Ir50 | 0.9 | 1.1 | 0.8 | 1.0 |
| 47 | SiO₂—Pt | Pt50—Ir50 | 0.8 | 1.1 | 0.7 | 1.4 |
| 48 | SiO₂—Ir | Ir50—Re50 | 0.9 | 1.0 | 0.8 | 1.2 |
| 49 | SiO₂—Pd | Pd50—W50 | 1.1 | 0.9 | 0.9 | 1.3 |
| 50 | SiC—Ph | Rh50—Ta50 | 1.5 | 1.9 | 1.4 | 1.7 |
| 51 | SiC—Pt | Pt50—Ru50 | 1.4 | 1.9 | 1.4 | 2.0 |
| 52 | SiC—Ru | Ru50—Re50 | 1.3 | 1.8 | 1.1 | 1.6 |
| 53 | Si₃N₄—Os | Os50—Rh50 | 1.6 | 1.9 | 1.3 | 1.5 |
| 54 | Si₃N₄—Pt | Pt50—Re50 | 0.8 | 1.4 | 0.8 | 1.7 |
| 55 | Si₃N₄—Re | Re50—Ta50 | 1.5 | 1.7 | 1.3 | 1.5 |
| 56 | None | MgF₂ | 1.9 | see 1) | 1.4 | see 1) |

Notes: 1) Glass Adhesion Occurred

As becomes clear from Table 3, even in the 3000th press-formed microlens, there was almost no change in the surface roughness (RMS value) compared to the first press-formed articles nor could formation of coarse protrusions be observed when the press-formed articles were manufactured with a press-molding die according to the present invention (Sample 38–55), whereas film exfoliation and adhesion of molten glass occurred within 3000 press-formations with the comparative example wherein the protective layer was made of magnesium fluoride.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A press-molding die comprising: a base material, an intermediate layer formed on a surface of the base material and a protective layer formed on the intermediate layer, wherein the base material comprises an inorganic oxide;

the intermediate layer comprises a material that adheres to both the base material and the protective layer and is heat resistant at high temperatures wherein the die is used; and the protective layer comprises at least one metal film selected from the group consisting of tungsten (W), platinum (Pt), palladium (Pd), rhodium (Rh), ruthenium (Ru), iridium (Ir), osmium (Os), rhenium (Re), tantalum (Ta) and alloys thereof, wherein said intermediate layer comprises a component that is included in the base material and a component that is included in the protective layer.

2. The press-molding die according to claim 1, wherein said base material comprises an inorganic oxide including silicon oxide or aluminum oxide as a main component.

3. The press-molding die according to claim 1, wherein said base material comprises an inorganic oxide that is a glass including silicon dioxide as a main component and at least one material selected from the group consisting of aluminum oxide, magnesium oxide, zinc oxide, alkali metal oxide and alkaline-earth metal oxide.

4. The press-molding die according to claim 3, wherein said glass has a glass transition temperature that is at least 50° C. higher than that of a glass to be press-molded.

5. The press-molding die according to claim 1, wherein said base material comprises at least one material selected from the group consisting of quartz glass and monocrystal alumina.

6. The press-molding die according to claim 1, wherein said intermediate layer comprises at least one material selected from the group consisting of titanium (Ti), vanadium (V), chrome (Cr), zirconium (Zr), niobium (Nb), molybdenum (Mo), hafnium (Hf), tantalum (Ta), tungsten (W) and alloys thereof.

7. The press-molding die according to claim 1, wherein
said base material comprises an inorganic oxide including aluminum oxide as a main component;
the protective layer comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and
the intermediate layer comprises a mixture of at least one aluminum compound selected from the group consisting of aluminum oxide and aluminum nitride with a component of the protective layer.

8. The press-molding die according to claim 1, wherein
said base material comprises an inorganic oxide including silicon oxide as a main component;
the protective layer comprises at least one metal film of the group consisting of tungsten (W), platinum (Pt), palladium (Pd), rhodium (Rh), ruthenium (Ru), iridium (Ir), osmium (Os), rhenium (Re), tantalum (Ta) and alloys thereof; and
the intermediate layer comprises a mixture of at least one silicon compound selected from the group consisting of silicon oxide, silicon carbide and silicon nitride with a component of the protective layer.

9. The press-molding die according to claim 1, wherein said surface of the base material has an average roughness of less than 5 nm.

10. The press-molding die according to claim 1, wherein the intermediate layer has a thickness of 0.1–5 $\mu$m.

11. The press-molding die according to claim 1, wherein the protective layer has a thickness of 0.05–3 $\mu$m.

* * * * *